United States Patent
Kim et al.

(10) Patent No.: US 7,329,619 B2
(45) Date of Patent: Feb. 12, 2008

(54) METHOD FOR PATTERNING THIN FILM, METHOD AND APPARATUS FOR FABRICATING FLAT PANEL DISPLAY

(75) Inventors: Yong Bum Kim, Seoul (KR); Jin Wuk Kim, Uiwang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/973,984

(22) Filed: Oct. 27, 2004
(Under 37 CFR 1.47)

(65) Prior Publication Data
US 2006/0115997 A1   Jun. 1, 2006

(30) Foreign Application Priority Data
Dec. 27, 2003   (KR) .................... 10-2003-0098129

(51) Int. Cl.
*H01L 21/31* (2006.01)
(52) U.S. Cl. .................. 438/782; 438/780; 438/690; 257/E21.259; 257/E21.492
(58) Field of Classification Search ............... 438/690, 438/780, 782; 257/E21.026, E21.259, E21.492
See application file for complete search history.

(56) References Cited
U.S. PATENT DOCUMENTS
6,517,995 B1 *   2/2003   Jacobson et al. ........... 430/320
6,964,793 B2 *   11/2005   Willson et al. ............. 427/466
2005/0042536 A1 *   2/2005   Cho et al. .................. 430/141

* cited by examiner

*Primary Examiner*—George Fourson
*Assistant Examiner*—Julio J. Maldonado
(74) *Attorney, Agent, or Firm*—McKenna Long & Aldridge LLP

(57) ABSTRACT

Disclosed is a method and apparatus for fabricating a patterned thin film layer within a flat panel display that employs a soft mold and heat treatment in place of a photolithographic process. The disclosed method may reduce process time as well as substantially minimize pattern deformities. A method of fabricating a thin film, a method and apparatus of fabricating a flat panel display according to an embodiment of the present invention includes the steps of forming a thin film on a substrate; coating an etch-resist solution including solvent over a substrate where the thin film has been formed; aligning a soft mold on the substrate provided with the etch-resist solution; forming a patterned etch-resist layer on the thin film by forming the etch-resist solution through a first heat treatment below the vaporization temperature of the solvent while pressure is applied to the soft mold on the etch-resist solvent; separating the soft mold from the patterned etch-resist layer; solidifying the patterned etch-resist layer through a second heat treatment; and etching the thin film by using the patterned etch-resist layer as a mask.

15 Claims, 6 Drawing Sheets

METHOD FOR PATTERNING THIN FILM, METHOD AND APPARATUS FOR FABRICATING FLAT PANEL DISPLAY

This application claims the benefit of Korean Patent Application No. P2003-98129 filed on Dec. 27, 2003, which is hereby incorporated by reference for all purposes as if fully set forth herein.

BACKGROUND OF THE INVENTION

1. Field of the Invention

The present invention relates to a flat panel display, and more particularly, to a method and apparatus for patterning a thin film, wherein the method and apparatus is adapted for patterning a thin film substantially without the use of photolithography, in a way that may reduce processing time and minimize pattern deformities.

2. Description of the Related Art

Display device are being emphasized more than ever as important visual information communication media. Traditional display devices include cathode ray tubes or Braun tubes, which make the display devices inconveniently large and heavy.

Various display technologies have been developed toward replacing the cathode ray tube, and thereby making the display smaller and lighter. These include liquid crystal display (LCD), field emission display (FED), plasma display panel (PDP), and electro-luminescence (EL) flat panel display technologies, most of which are put to practical use and are on the market.

With recent improvements to its mass production processes, liquid crystal display technology, in particular, has rapidly been replacing the cathode ray tube devices within many applied fields, since the LCD technology provides for devices that are generally light and thin.

In particular, the active matrix type of liquid crystal display, which drives liquid crystal cells by use of thin film transistors (hereinafter "TFT"), has excellent picture quality and low power consumption and is being developed to larger sizes and higher resolutions as a result of research and development and the securing of mass production technology.

An active matrix type of liquid crystal display, as illustrated in FIG. 1, includes a color filter array substrate 22 and a TFT array substrate 23 bonded together with a liquid crystal layer 15 between them. The liquid crystal display illustrated in FIG. 1 represents a part of the whole effective screen area.

The color filter array substrate 22 has a black matrix (not shown), a color filter 13 and a common electrode 14 formed on the rear surface of an upper glass substrate 12. A polarizer 11 is affixed to the front surface of the upper glass substrate 12. The color filter 13 includes red, green and blue color filters to transmit visible light in a specific wavelength band, thereby enabling color display.

On the front surface of the lower glass substrate 16 of the TFT array substrate 23, data lines 19 and gate lines 18 generally cross one another with TFTs formed at their crossing. A pixel electrode 21 is formed at a cell area defined by the data lines 19 and the gate lines 18 on the front surface of the lower glass substrate 16. The TFT 20 drives the pixel electrode 21 by switching a data transmission path between the data line 19 and the pixel electrode 21 in response to a scan signal from the gate line 18. A polarizer 17 is generally affixed to the rear surface of the TFT array substrate 23.

The liquid crystal layer 15 controls the transmission of light incident through the TFT array substrate 23 to an extent proportional to the electric field applied to the liquid crystal material.

The polarizers 11 and 17 that are respectively affixed to the color filter array substrate 22 and the TFT substrate 23 each transmit light polarized in one direction, and their polarizing directions cross each other for certain LCD modes, such as a 90° TN mode.

An alignment film (not shown) may be formed on the opposite interior surfaces of the color filter array substrate 22 and the array TFT substrate 23.

A typical related art fabricating process for producing the active matrix type of liquid crystal display may be divided into a substrate cleaning process, a substrate patterning process, an alignment forming/rubbing process, a substrate bonding/liquid crystal injection process, a mounting process, an inspection process, and a repair process.

The substrate cleaning process removes impurities contaminating the substrate surface of the liquid crystal display. The substrate patterning process is generally divided into the patterning process of the color filter substrate and the patterning process of the TFT array substrate. The alignment film forming/rubbing process coats an alignment film onto each of the color filter substrate and the TFT array substrate and rubs the alignment film with rubbing cloth. The substrate bonding/liquid crystal injection process bonds the color filter substrate with the TFT array substrate by use of a sealant and injects liquid crystal and spacers through a liquid crystal injection hole, and then seals the liquid crystal injection hole. The mounting process connects a tape carrier package (TCP) to a pad part of the substrate, wherein the TCP has integrated circuits such as a gate drive IC and data drive IC mounted on it. Alternately, the drive integrated circuit can be mounted to the substrate directly by using chip-on-glass (COG) technology. The inspection process generally includes an electrical inspection conducted after the data lines, the gate lines, and the pixel electrodes are formed on the TFT array substrate. An electrical inspection and a naked-eye inspection may be conducted after the substrate bonding/liquid crystal injection process. The repair process conducts restoration for those substrates that are judged to be repairable by the inspection process. A substrate that is judged to be un-repairable in the inspection process is discarded.

Generally, a photolithography process is used to pattern thin film materials making up display devices discussed above. The photolithography process includes the coating of photo-resist, mask alignment, exposure, development, and cleaning. However, there is a problem in that the required time for the process is long, the photo-resist material and stripping solution is generally wasteful, and expensive equipment such as exposure equipment is required.

SUMMARY OF THE INVENTION

Accordingly, the present invention is directed to a method for patterning a thin film, a method and apparatus for fabricating a flat panel display that substantially obviates one or more of the problems due to limitations and disadvantages of the related art.

An advantage of the present invention is to provide a fabrication method that is adaptive for conducting a patterning process without using a photolithography process, thereby reducing process time and minimizing pattern deformities.

In order to achieve these and other advantages of the invention, a method of fabricating a flat panel display comprises the steps of: forming a thin film on a substrate; applying an etch-resist solution having a solvent to the substrate; aligning a soft mold on the substrate; applying a first heat treatment to the etch-resist solution while applying a pressure to the soft mold on the etch-resist solution, the first heat treatment having a first temperature below a vaporization temperature of the solvent, thereby substantially forming a patterned etch-resist layer; separating the soft mold from the patterned etch-resist layer; applying a second heat treatment to the patterned etch-resist layer; and etching the thin film using the patterned etch-resist layer as a mask.

The method of fabrication further includes the step of forming an etch-resist solution before the step of applying an etch-resist solution.

In the method of fabrication, the etch-resist solution includes a solvent having about 40 wt %-60 wt %; a cross-linkable polymer resin having about 30 wt %-50 wt %; and a cross-linker having about 1 wt %-5 wt %.

In the method of fabrication, the cross-linkable polymer resin includes phenol-novolac resin.

In the method of fabrication, the cross-linker includes at least one of an amine family cross linker, a melamine family cross linker and a urea family cross linker.

In the method of fabrication, the step of applying a first heat treatment temperature includes the step of applying a temperature of approximately 40° C.-60° C. for about 10 minutes.

In the method of fabrication, the step of applying a second heat treatment includes the step of applying a second temperature approximately equal to or greater than a vaporization temperature of the solvent.

In the method of fabrication, the step of applying a second heat treatment includes the step of applying a temperature of approximately 70° C.-120° C. for about 2 minutes.

In the method of fabrication, the step of applying a second heat treatment includes the step of applying a second temperature that is greater than the first temperature.

In the method of fabrication, the flat panel display is one of a liquid crystal display, a field emission display, a plasma display panel, an electro-luminescence device, and a semiconductor device.

In order to achieve these and other advantages of the invention, an apparatus for fabricating a flat panel display comprises a coater to coat an etch-resist solution having a solvent over a substrate on which a thin film has been formed; a soft mold that is alignable with the substrate; an aligning means for aligning the soft mold to the substrate; a heating means for applying heat to the substrate; and an etching means to etch the thin film using the patterned etch-resist layer as a mask.

The apparatus further comprises a pressure means for applying pressure to the soft mold aligned to the substrate.

In the apparatus, the heating means includes a means for applying to the substrate a first temperature of approximately 40° C.-60° C. for about 10 minutes.

In the apparatus, the heating means includes a means for applying a first temperature and a second temperature to the substrate, wherein the second temperature is higher than the first temperature.

In the apparatus, the means for applying a first temperature and a second temperature to the substrate includes a means for applying the second temperature of approximately 70° C.-120° C. for about 2 minutes.

In the apparatus, the flat panel display is one of a liquid crystal display, a field emission display, a plasma display panel, an electro-luminescence device, and a semiconductor device.

In order to achieve these and other advantages of the invention, a method of patterning a thin film comprises forming a thin film on a substrate; applying an etch-resist solution having a solvent to the substrate; aligning a soft mold on the substrate; applying a first heat treatment below the vaporization temperature of the solvent while applying a pressure to the soft mold on the etch-resist solvent, thereby substantially forming a patterned etch-resist layer; separating the soft mold from the patterned etch-resist layer; solidifying the patterned etch-resist layer; and etching the thin film using the patterned etch-resist layer as a mask.

In the method of patterning, the step of solidifying the patterned etch-resist layer includes the step of applying a second heat treatment to the patterned etch-resist layer.

In the method of patterning, the step of applying a second heat treatment includes the step of applying a second temperature of approximately 70° C.-120° C. for about 2 minutes.

In the method of patterning, the step of applying a first heat treatment includes the step of applying a temperature of around 40° C.-60° C. for about 10 minutes.

In the method of patterning, the step of applying a second heat treatment includes the step of applying a second temperature approximately equal to or greater than a vaporization temperature of the solvent.

The method of patterning further includes the step of forming an etch-resist solution before the step of applying an etch-resist solution.

In the method-of pattering, the etch-resist solution includes a solvent having about 40 wt %-60 wt %; a cross-linkable polymer resin having about 30 wt %-50 wt %; and a cross-linker having about 1 wt %-5 wt %.

In the method of patterning, the cross-linkable polymer resin includes phenol-novolac resin.

In the method of patterning, the cross-linker includes at least one of an amine family cross linker, a melamine family cross linker and a urea family cross linker.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to exemplary embodiments of the present invention, examples of which are illustrated in the accompanying drawings Hereinafter, the exemplary embodiments of the present invention will be described in detail with reference to FIGS. 2 to 6.

Figure 1:
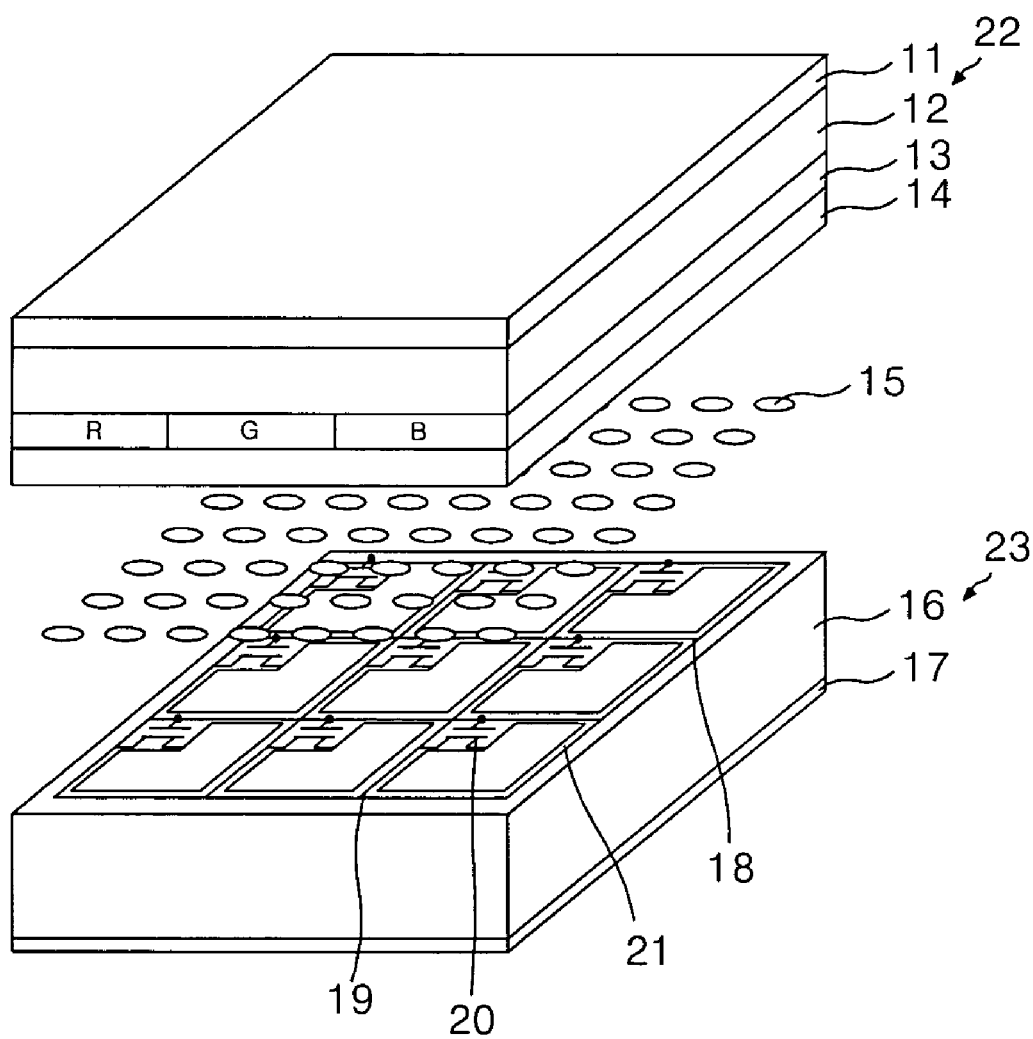
FIG. 1 is a perspective view representing an active matrix type of liquid crystal display.
Figure 2:
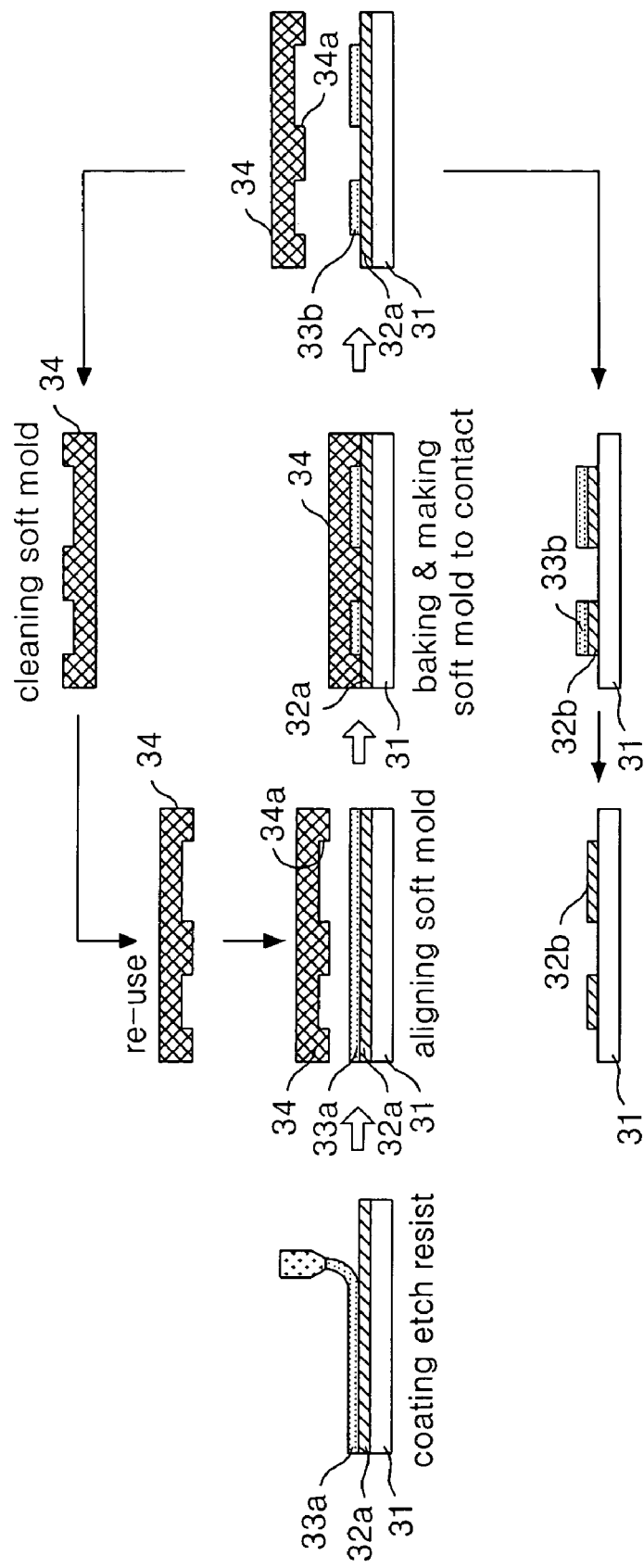
FIG. 2 is a diagram representing an exemplary fabricating method of a flat panel display according to an embodiment of the present invention.

Referring to FIG. 2, an exemplary fabrication method of a flat panel display according to an embodiment of the present invention includes an etch-resist coating process in which an etch-resist solution 33a is substantially coated over a glass substrate 31 having a thin film 32a using a coating device; a process for patterning the etch-resist solution 33a using a soft mold 34; an etching process for the patterning the thin film 32a; a stripping process to remove the etch-resist pattern 33b and an inspection process for the patterned thin film layer 32b.

The thin film 32a of the pixel array formed on the glass substrate 31 may include a basic material such as that used for a patterned metal layer; a patterned organic layer; or a patterned inorganic layer, like any that might be found in a pixel array of a flat panel display. The material may be formed on the glass substrate 31 by any well known coating or deposition process.

The etch-resist solution 33a may be a material having heat resistance and chemical resistance. In the exemplary process, the etch-resist solution 33a is patterned to form a patterned etch-resist layer 33b, which subsequently serves as a mask that substantially enables the thin film 32a to be selectively patterned by an etching process.

Figure 3:
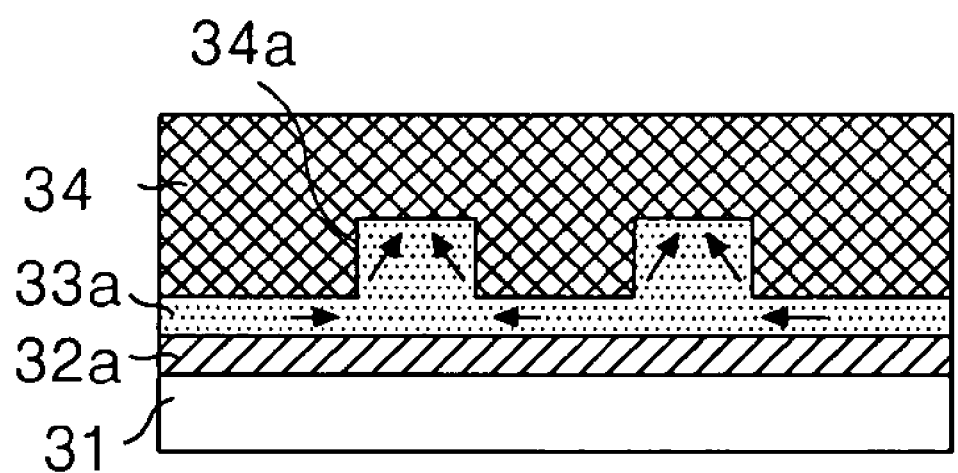
FIG. 3 is a diagram representing the motion of etch-resist solution when a substrate is in touch with a soft mold shown in FIG. 2.

The soft mold 34 may include an engraved pattern or plurality of grooves 34a corresponding to the pattern to be formed on the glass substrate 31. In the exemplary process, the soft mold 34 is aligned on the etch-resist solution 33a. With the soft mold 34 aligned, pressure is then applied to the soft mold 34, substantially directed toward the etch-resist solution 33a. The amount of pressure applied may minimally be that which is required for the soft mold 34 to be in touch with the thin film 32a, for example, the extent of it own weight. While pressure is being applied to the soft mold 34, the glass substrate 31 may be subject to a heat treatment, such as baking. As pressure and heat are applied to the soft mold 34 and the glass substrate 31, the etch-resist solution 33a may move into the grooves 34a of the soft mold 34, as illustrated in FIG. 3, under such forces as the capillary force generated by pressure between the soft mold 34 and the glass substrate 31, and the repulsive force between the soft mold 34 and the etch-resist solution 33a, substantially solidifying the etch-resist solution 33a in a pattern corresponding to the engraved pattern 34a on the soft mold 34. As a result, the etch-resist pattern 33b is formed on the thin film 32a in a reverse-transferred pattern.

In the exemplary process, after the soft mold 34 is separated from the glass substrate 31, the substrate 33 is subject to an etching process, which may be a wet etching process using a wet etching device or a dry etching process using a dry etching device. At this stage of the process, the etch-resist pattern 34b acts generally like a mask, and the portion of the thin film 32a located under the etch-resist pattern 34 may be the only portion remaining on the glass substrate 31. Other portions of the thin film 32 may be removed. Subsequently, the etch-resist pattern 34c may be removed by a stripping process. The stripping process may include, for example, a stripping solution. With the etch-resist removed, the substrate may be evaluated for the quality of the patterned thin film layer 32b via electrical and/or optical inspection techniques.

After the soft mold 34 is separated from the glass substrate 31, it may be cleaned using an appropriate cleaning technique, such as ultra violet light (UV) and ozone ($O_3$), and then re-used for the patterning process of another thin film 32a.

Figure 4:
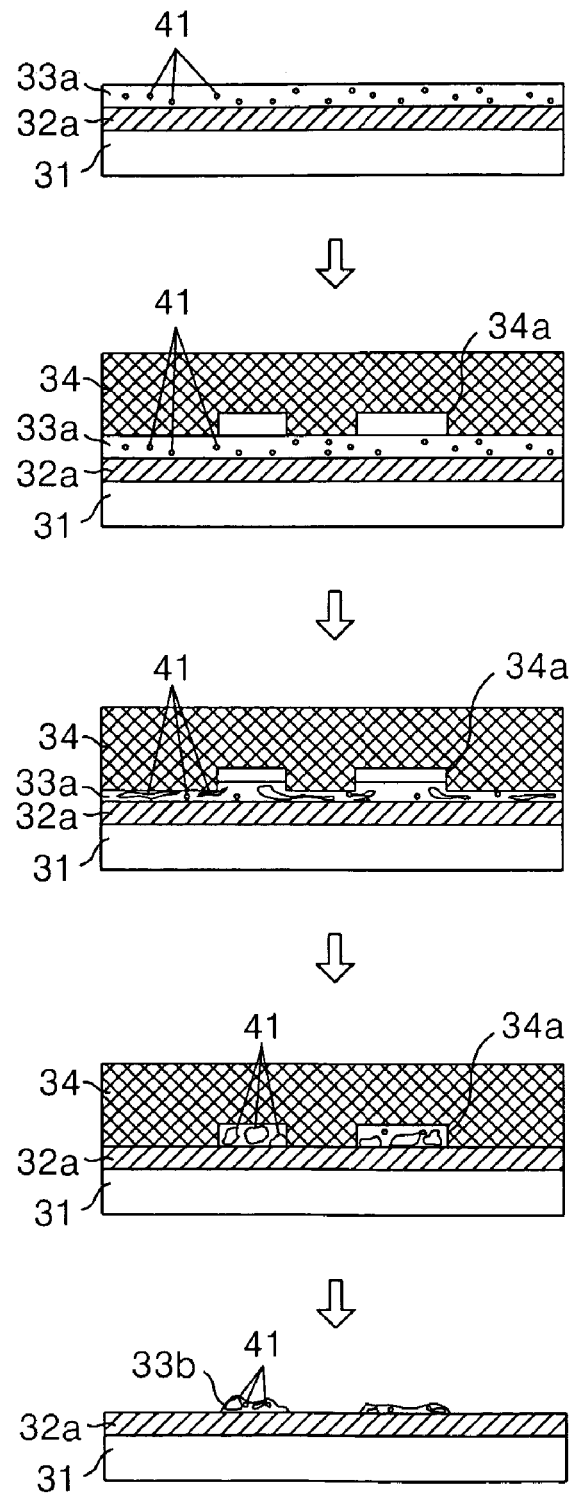
FIG. 4 is a sectional diagram representing air bubbles generated during the process of FIG. 2, and the pattern deformities in the etch-resist due to the air bubbles.

In the etch-resist patterning process, air bubbles might be generated within the etch-resist solution 33a by factors such as outgassing generated by the volatile solvent within the etch-resist solution 33a, and/or external air flowing into the etch-resist solution 33a. Such air bubbles may be generated if the evaporation speed of the solvent is faster than the rate at which the etch-resist solution 33a solidifies while absorbing the solvent of the etch-resist solution 33a. Such air bubbles 41, as illustrated in FIG. 4, may be increased and agglutinated by the pressure applied to the soft mold 34 as well as by the baking process. The resulting air bubbles may cause the etch-resist material 33a to deform, resulting in the loss of quality of the patterned etch-resist layer 33b. Such air bubbles may also be generated at normal temperature.

To minimize the air bubbles generated in the patterning process of the etch-resist 34a, the exemplary fabrication method may include mixing a cross-linker into the etch-resist solution 33a and inducing the cross-linking of the etch-resist solution 33a through a heat treatment process, thereby substantially suppressing the vaporization of solvent and the occurrence of air bubbles.

For this, a cross-linkable polymer resin, a cross-linker and a solvent may be mixed in a designated composition ratio into the etch-resist solution 33a according to the present invention. Table 1 represents three exemplary compositions of the etch-resist solution 33a.

TABLE 1

|  | Cross-linkable polymer | Cross-linker | Solvent |
| --- | --- | --- | --- |
| Example 1 | Phenol-Novolac resin (30-50 wt %) | Amine family cross-linker (1-5 wt %) | Isopropanol (40-60 wt %) |
| Example 2 | Phenol-Novolac resin (30-50 wt %) | Melamine family cross-linker (1-5 wt %) | Isopropanol (40-60 wt %) |
| Example 3 | Phenol-Novolac resin (30-50 wt %) | Urea cross-linker (1-5 wt %) | Isopropanol (40-60 wt %) |

In Table 1, the figure inside parentheses '( )' means a composition ratio, or weight percentage (wt %).

Figure 5:
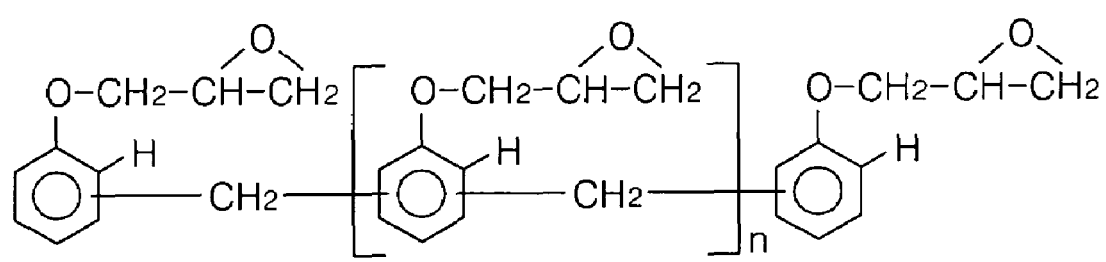
FIG. 5 is a diagram representing a phenol-novolac resin structure.

The phenol-novolac resin has a structure as of FIG. 5 and is well known as an excellent heat-resistant and chemical resistant polymer. The amine family cross-linker, the melamine family cross-linker and the urea cross linker may be used as a well known cross-linker. For instance, N,N'-bis(2-methyl-2-nitropropyl)1,6-hexanediamine may be selected as the amine family cross-linker.

Figure 6:
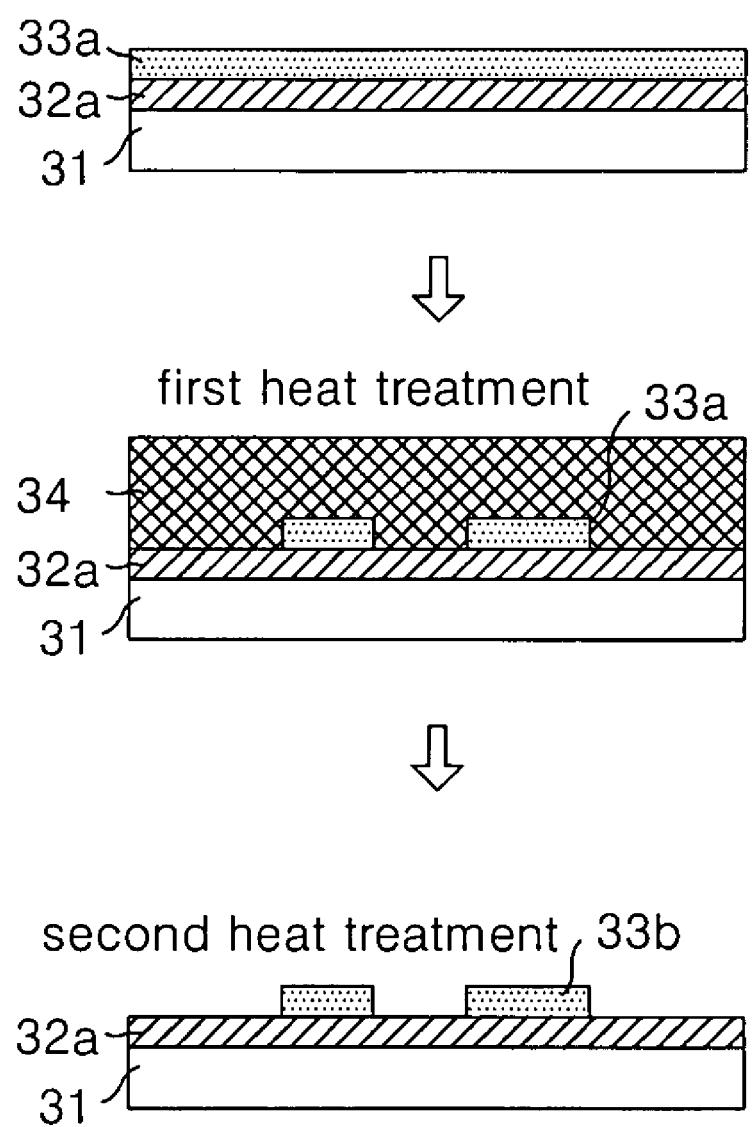
FIG. 6 is a diagram representing a process of forming the etch-resist in detail according to the present invention.

In order to induce cross-linking within the etch-resist solution 33a, the exemplary fabricating method of the flat panel display according to the present invention may include a first heat treatment in which heat is applied to the soft mold 34 on the etch-resist solution 33a, and a second heat treatment after the soft mold 34 is separated from the etch-resist solution 33a, as shown in FIG. 6.

FIG. 6 illustrates the substrate as it is subjected to two exemplary heat treatments. In the first exemplary heat treatment, the soft mold 34 is in substantial contact with the etch-resist solution 33a when the substrate 31 is heated by a heater at a temperature of around 40° C.-60° C. for about 10 minutes. The etch-resist solution 33a is generally not vaporized in the first heat treatment, and cross-linking may be induced when the pressure is applied to the soft mold 34 in a consistent manner. In one embodiment, the pressure substantially corresponds to the weight of the soft mold 34. At this stage in the process, the cross-linker in the etch-resist solution 33a may accelerate a photo-polymerization reaction of the etch-resist to induce the solidification of the etch-resist solution 33A, thereby forming the etch-resist in a desired shape corresponding to the engraved pattern 34a on the soft mold 34. The first heat treatment temperature may be below the vaporizing temperature of the solvent included in the etch-resist solution 33a. Accordingly, there are substantially no air bubbles generated because the solvent is not vaporized in the course of the forming of the etch-resist solution 33a by the soft mold 34. That is, substantially no air bubbles caused by the solvent are generated while forming the etch-resist solution 33a by the first heat treatment.

According to the second exemplary hear treatment, after the soft mold 34 is separated from the etch-resist pattern 33B, heat may be applied to the substrate 31 by the heater at a temperature of around 70° C.-120° C. for about 2 minutes. Preferably, the temperature applied to the substrate 31 during the second exemplary heat treatment is greater than the vaporization temperature of the solvent. The second heat treatment substantially vaporizes the solvent within the etch-resist pattern 33b. Accordingly, the etch-resist pattern 33b may be completely solidified by the second heat treatment. Further, the second heat treatment may enhance the packing level of the etch-resist pattern 33b, thereby enhancing chemical resistance against an etchant.

The exemplary fabrication method of a flat panel display according to the present invention may be applied to a process for patterning an electrode layer, an organic material layer and an inorganic material layer of a flat panel display such as LCD, FED, PDP, EL and other devices.

As described above through exemplary embodiments, the method and apparatus for fabricating a flat panel display according to the present invention may reduce the processing time otherwise incurred during a photolithography process, by use of the soft mold and the etch-resist in place of photolithography. Furthermore, the exemplary fabrication method of the flat panel display according to the present invention provides exemplary compositions for the etch-resist solution, which may comprise a cross-linkable polymer resin+cross-linker+solvent, and may provide for the formation of a patterned etch-resist layer substantially without the occurrence of air bubbles through the first heat treatment at around the vaporization temperature of the solvent, which may minimize air bubble-induced deformities in the etch-resist.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a flat panel display, comprising the steps of:
   forming an etch-resist solution including a solvent having about 40 wt %-60 wt %;
   a cross-linkable polymer resin having about 30 wt %-50 wt %, and
   a cross-linker having about 1 wt %-5 wt % forming a thin film on a substrate;
   applying the etch-resist solution having a solvent to the substrate;
   aligning a soft mold on the substrate;
   applying a first heat treatment to the etch-resist solution while applying a pressure to the soft mold on the etch-resist solution, the first heat treatment having a first temperature below a vaporization temperature of the solvent, thereby substantially forming a patterned etch-resist layer;
   separating the soft mold from the patterned etch-resist layer;
   applying a second heat treatment to the patterned etch-resist layer; and
   etching the thin film using the patterned etch-resist layer as a mask, wherein the step of applying a first heat treatment temperature includes the step of applying a temperature of approximately 40° C.-60° C. for about 10 minutes.

2. The fabricating method according to claim 1, wherein the cross-linkable polymer resin includes phenol-novolac resin.

3. The fabricating method according to claim 1, wherein the cross-linker includes at least one of an amine family cross linker, a melamine family cross linker and a urea family cross linker.

4. The fabricating method according to claim 1, wherein the step of applying a second heat treatment includes the step of applying a second temperature approximately equal to or greater than a vaporization temperature of the solvent.

5. The fabricating method according to claim 4, wherein the step of applying a second heat treatment includes the step of applying a temperature of approximately 70° C.-120° C. for about 2 minutes.

6. The fabricating method according to claim 1, wherein the step of applying a second heat treatment includes the step of applying a second temperature that is greater than the first temperature.

7. The fabricating method according to claim 6, wherein the step of applying a second heat treatment includes the step of applying a temperature of approximately 70° C.-120° C. for about 2 minutes.

8. The fabricating method according to claim 1, wherein the flat panel display is one of a liquid crystal display, a field emission display, a plasma display panel, an electro-luminescence device, and a semiconductor device.

9. A method of patterning a thin film comprising:
   forming an etch-resist solution including a solvent having about 40 wt %-60 wt %;
   a cross-linkable polymer resin having about 30 wt %-50 wt %, and
   a cross-linker having about 1 wt %-5 wt % forming a thin film on a substrate;
   applying the etch-resist solution having a solvent to the substrate;
   aligning a soft mold on the substrate;
   applying a first heat treatment below a vaporization temperature of the solvent while applying a pressure to the soft mold on the etch-resist solvent, thereby substantially forming a patterned etch-resist layer;
   separating the soft mold from the patterned etch-resist layer;

solidifying the patterned etch-resist layer; and etching the thin film using the patterned etch-resist layer as a mask, wherein the step of applying a first heat treatment temperature includes the step of applying a temperature of approximately 40° C.-60° C. for about 10 minutes.

10. The method of claim 9, wherein the step of solidifying the patterned etch-resist layer includes the step of applying a second heat treatment to the patterned etch-resist layer.

11. The method of claim 10, wherein the step of applying a second heat treatment includes the step of applying a second temperature of approximately 70° C.-120° C. for about 2 minutes.

12. The fabricating method according to claim 10, wherein the step of applying a second heat treatment includes the step of applying a second temperature approximately equal to or greater than a vaporization temperature of the solvent.

13. The fabricating method according to claim 9, wherein the cross-linkable polymer resin includes phenol-novolac resin.

14. The fabricating method according to claim 9, wherein the cross-linker includes at least one of an amine family cross linker, a melamine family cross linker and a urea family cross linker.

15. A method of fabricating a flat panel display, comprising the steps of:

forming an etch-resist solution including a solvent having about 40 wt %-60 wt %;

a cross-linkable polymer resin having about 30 wt %-50 wt %, and a cross-linker having about 1 wt %-5 wt % forming a thin film on a substrate;

applying the etch-resist solution having a solvent to the substrate;

aligning a soft mold on the substrate;

applying a first heat treatment to the etch-resist solution while applying a pressure to the soft mold on the etch-resist solution, the first heat treatment having a first temperature below a vaporization temperature of the solvent, thereby substantially forming a patterned etch-resist layer;

separating the soft mold from the patterned etch-resist layer;

applying a second heat treatment to the patterned etch-resist layer;

etching the thin film using the patterned etch-resist layer as a mask;

cleaning the soft mold; and re-using the soft mold in the patterning of another thin film.

* * * * *